US011277912B2

(12) United States Patent
Hong et al.

(10) Patent No.: US 11,277,912 B2
(45) Date of Patent: Mar. 15, 2022

(54) SYSTEM OF PROVIDING POWER

(71) Applicant: Delta Electronics (Shanghai) CO., LTD, Shanghai (CN)

(72) Inventors: Shouyu Hong, Shanghai (CN); Zhiheng Fu, Shanghai (CN); Haoyi Ye, Shanghai (CN); Qingdong Chen, Shanghai (CN); Yiqing Ye, Shanghai (CN); Jinping Zhou, Shanghai (CN); Xiaoni Xin, Shanghai (CN); Pengkai Ji, Shanghai (CN); Min Zhou, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 98 days.

(21) Appl. No.: 16/943,131

(22) Filed: Jul. 30, 2020

(65) Prior Publication Data
US 2020/0359496 A1 Nov. 12, 2020

Related U.S. Application Data

(63) Continuation-in-part of application No. 16/251,554, filed on Jan. 18, 2019, now Pat. No. 10,845,853.

(30) Foreign Application Priority Data

Feb. 1, 2018 (CN) .......................... 201810103774.5
Jul. 15, 2020 (CN) .......................... 202010678690.1

(51) Int. Cl.
*G06F 1/32* (2019.01)
*G06F 11/10* (2006.01)
(Continued)

(52) U.S. Cl.
CPC ............. *H05K 1/113* (2013.01); *G06F 1/189* (2013.01); *G06F 1/263* (2013.01); *H02M 3/158* (2013.01);
(Continued)

(58) Field of Classification Search
CPC ............... H02M 1/0058; H02M 3/285; H02M 3/33569; H02M 3/158; H02M 3/003;
(Continued)

(56) References Cited

U.S. PATENT DOCUMENTS 10,985,645 B2 * 4/2021 Cai ...................... H02M 3/337
2008/0068237 A1 * 3/2008 Jeon .................... H03M 1/1225
341/122
(Continued)

FOREIGN PATENT DOCUMENTS

| CN | 1371544 A | 9/2002 |
| CN | 101588125 A | 11/2009 |
| CN | 104578768 A | 4/2015 |

OTHER PUBLICATIONS

The Decision of Rejection dated Jul. 28, 2021 for CN patent application 201810103774.5.

*Primary Examiner* — Jared Fureman
*Assistant Examiner* — Esayas G Yeshaw
(74) *Attorney, Agent, or Firm* — Qinghong Xu

(57) ABSTRACT

A system of providing power including: a preceding-stage power supply module, a post-stage power supply module and a load, connected in sequence; a projection on the mainboard of a smallest envelope area formed by contour lines of the preceding-stage power supply module and the load at least partially overlaps with a projection of the post-stage power supply module; the preceding-stage power supply module includes a plurality of sets of preceding-stage output pins and preceding-stage ground pins alternately arranged to form a first rectangular envelope area, and the load is disposed on a side of a long side of the first rectangular envelope area; and the load comprises a load input pin and a load ground pin forming a second rectangular envelope area, and a center line of the first rectangular
(Continued)

envelope area and the second rectangular envelope area is perpendicular to the long side of the first rectangular envelope area.

17 Claims, 19 Drawing Sheets

(51) Int. Cl.
| | | |
|---|---|---|
| *H05K 1/11* | (2006.01) | |
| *H05K 1/02* | (2006.01) | |
| *H05K 1/18* | (2006.01) | |
| *H02M 3/335* | (2006.01) | |
| *G06F 1/18* | (2006.01) | |
| *G06F 1/26* | (2006.01) | |
| *H02M 3/158* | (2006.01) | |

(52) U.S. Cl.
CPC ...... *H02M 3/33592* (2013.01); *H05K 1/0254* (2013.01); *H05K 1/181* (2013.01); *H05K 2201/093* (2013.01); *H05K 2201/094* (2013.01); *H05K 2201/09972* (2013.01)

(58) Field of Classification Search
CPC . H02M 3/33592; Y02B 70/10; H05K 1/0227; H05K 1/113; H05K 2201/094; H05K 1/0262; H05K 2201/093; H05K 1/0254; H05K 1/181; H05K 2201/09972; G06F 1/189; G06F 1/263
See application file for complete search history.

(56) References Cited

U.S. PATENT DOCUMENTS

| | | | |
|---|---|---|---|
| 2010/0148869 A1* | 6/2010 | Kawakami | H03F 1/56 330/255 |
| 2011/0103098 A1* | 5/2011 | Wu | H02M 1/36 363/17 |
| 2017/0093275 A1* | 3/2017 | Xie | H02M 1/42 |
| 2018/0373315 A1* | 12/2018 | Gendler | G06F 11/1076 |
| 2019/0074771 A1* | 3/2019 | Zeng | H02M 3/1588 |
| 2020/0295749 A1* | 9/2020 | Akahane | H03K 17/162 |

* cited by examiner

SYSTEM OF PROVIDING POWER

CROSS REFERENCE

This application is a continuation-in-part application of U.S. application Ser. No. 16/251,554 filed on Jan. 18, 2019 and entitled "SYSTEM OF PROVIDING POWER TO CHIP ON MAINBOARD" based upon and claims priority to Chinese Patent Application No. 201810103774.5, filed on Feb. 1, 2018, and further claims priority to Chinese Patent Application No. 202010678690.1, filed on Jul. 15, 2020. The entire contents thereof are incorporated herein by reference.

TECHNICAL FIELD

The disclosure relates to the technical field of power supplies on mainboards, particularly to a system of providing power to a chip.

BACKGROUND

With the improvement of requirements for smart living of people, the demand for data processing in society is growing. The core of data processing lies in various types of intelligent processor chips. The exertion of the performance of the processor chip should be based on a stable voltage, so the steady-state performance and dynamic performance of the power supply to the processor chip are key factors. In order to reduce transmission loss, the power supply structure of a data center is constantly evolving. It is a trend to adopt a bus voltage of 48V or higher, such as a high DC (Direct current) bus voltage of 400V, to continuously improve power consumption of a data center. The increase of the bus voltage may increase the input of a point-of-load (POL) power supply from 12V to 48V or even to 400V. The increase of input voltage greatly increases the voltage difference between the input and output of a power supply on a mainboard, which poses a new challenge to the power supply of the processor chip in a server.

Therefore, the pin design, arrangement and interconnection of each module in the system of providing power are very important to the efficiency of providing power.

The above information disclosed in the background section is only for enhancing the understanding of the background of the present disclosure, so it may include information that does not constitute prior art known to those of ordinary skill in the art.

SUMMARY

The present disclosure provides a system of providing power, and the system can shorten transmission distance and reduce transmission loss.

Other features and advantages of the present disclosure will become apparent from the following detailed description, or will be partly obtained by practice of the present disclosure.

According to an aspect of the present disclosure, a system of providing power disposed on a mainboard is provided, including: a preceding-stage power supply module, a post-stage power supply module and a load, wherein the preceding-stage power supply module is electrically connected to the post-stage power supply module, and the post-stage power supply module is electrically connected to the load; a projection on the mainboard of a smallest envelope area, which is formed by contour lines of the preceding-stage power supply module and the load, at least partially overlaps with a projection of the post-stage power supply module on the mainboard; the preceding-stage power supply module includes a plurality of sets of preceding-stage output pins and preceding-stage ground pins, the preceding-stage output pins and the preceding-stage ground pins are alternately arranged to form a first rectangular envelope area, and the load is disposed on a side of a long side of the first rectangular envelope area; and the load includes a load input pin and a load ground pin, the load input pin and the load ground pin form a second rectangular envelope area, and a center line of the first rectangular envelope area and the second rectangular envelope area is perpendicular to a straight line where the long side of the first rectangular envelope area is located.

In the system of providing power according to the present disclosure, the projection on the mainboard of the smallest envelope area, which is formed by the contour lines of the preceding-stage power supply module and the load, at least partially overlaps with a projection of the post-stage power supply module on the mainboard, which can make the transmission distance from the preceding-stage power supply module to the post-stage power supply module and the post-stage power supply module to the load the shortest, thus reducing the transmission loss. The plurality of sets of the preceding-stage output pins and the preceding-stage ground pins of the preceding-stage power supply module are alternately arranged, which have a good current sharing effect. The preceding-stage output pins and the preceding-stage ground pins are alternately arranged to form the first rectangular envelope area. The load is disposed on a side of the long side of the first rectangular envelope area. The load input pin and the load ground pin form a second rectangular envelope area. A center line of the first rectangular envelope area and the second rectangular envelope area is perpendicular to a straight line where the long side of the first rectangular envelope area is located, which can shorten the connection distance that the preceding-stage power supply module is connected to the mainboard through the conductive pillars and then connected to the post-stage power supply module, and reduce the transmission loss.

It should be understood that the above general description and the following detailed description are only exemplary and do not limit the present disclosure.

BRIEF DESCRIPTION OF THE DRAWINGS

The above and other features and advantages of the present disclosure will become more apparent by describing exemplary embodiments thereof with reference to accompanying drawings.

DETAILED DESCRIPTION

Figure 1:
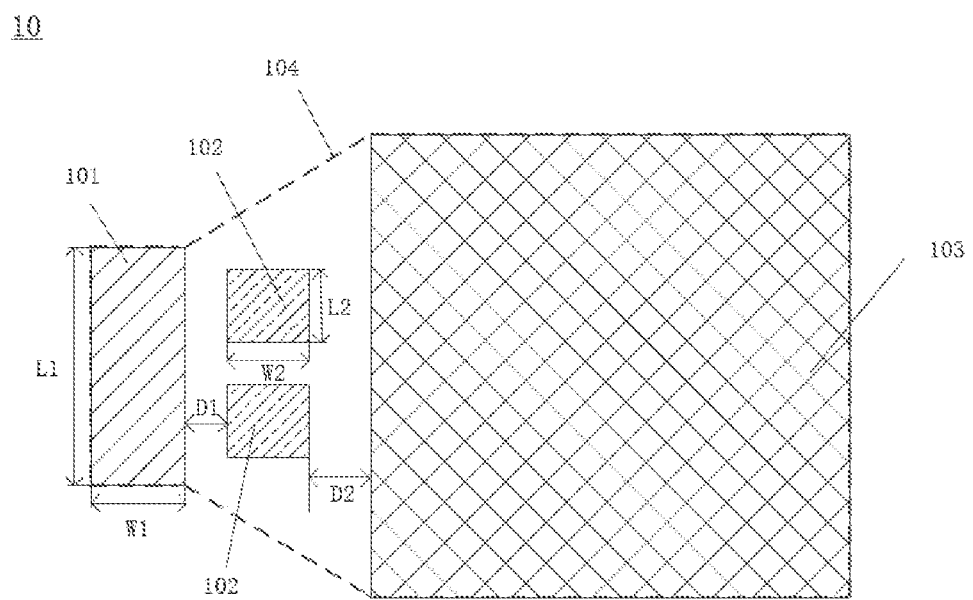
FIG. 1 is a structural schematic diagram of a system of providing power according to an exemplary embodiment.

Exemplary embodiments will now be described more fully with reference to the accompanying drawings. However, the exemplary embodiments can be embodied in a variety of forms and should not be construed as being limited to the embodiments set forth herein. Rather, these embodiments are provided so that the present disclosure will be thorough and complete and the concepts of the exemplary embodiments are fully conveyed to those skilled in the art. The drawings are only schematic illustrations of the present disclosure and are not necessarily drawn to scale. The same reference numerals in the drawings denote the same or similar parts, and the repeated description thereof will be omitted.

Furthermore, the described features, structures or characteristics may be combined in any suitable manner in one or more embodiments. In the following description, numerous specific details are set forth to provide a thorough illustration to the embodiments of the disclosure. However, one skilled in the art will appreciate that the technical solution of the disclosure may be practiced without one or more of the specific details, or may be practiced by employing other structures, components, steps, methods, etc. In other instances, well known structures, components or operations are not shown or described in detail to avoid obscuring the respective aspects of the disclosure.

The terms "first" and "second" are used for descriptive purposes only, and cannot be understood as indicating or implying relative importance or implicitly indicating the number of technical features indicated. Thus, the features defined as "first" and "second" may explicitly or implicitly include one or more of the features.

FIG. 1 is a structural schematic diagram of a system of providing power according to an exemplary embodiment.

Figure 2:
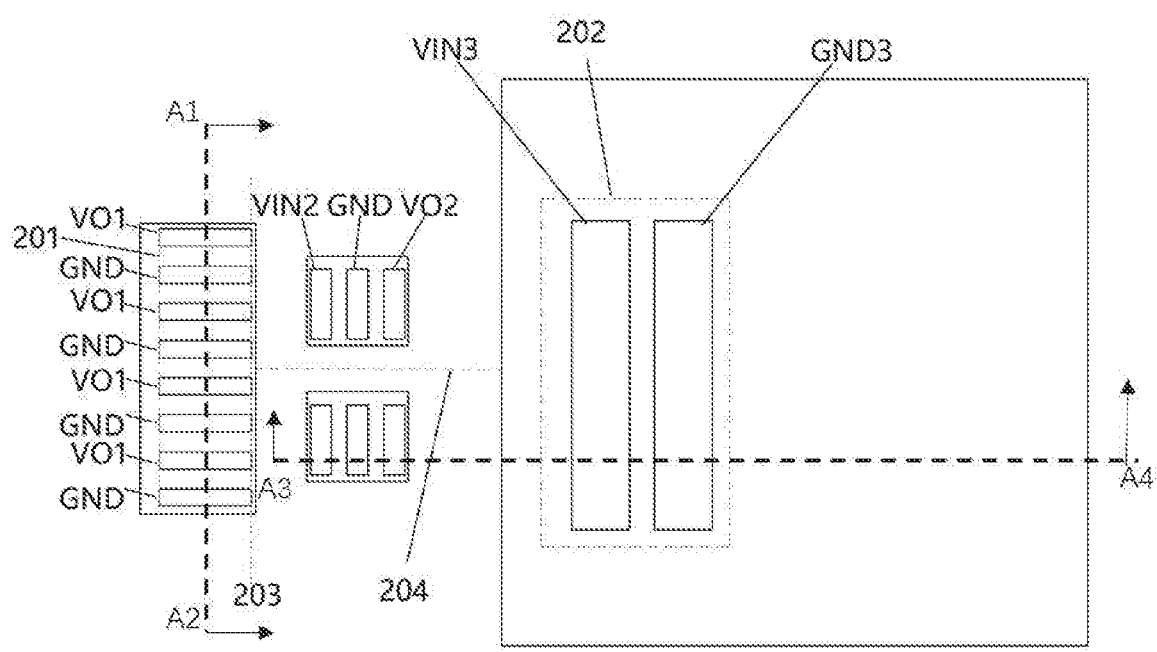
FIG. 2 is a pin schematic diagram of a system of providing power according to an exemplary embodiment.

FIG. 2 is a pin schematic diagram of a system of providing power according to an exemplary embodiment.

As shown in FIG. 1, a system 10 of providing power may include a preceding-stage power supply module 101, a post-stage power supply module 102 and a load 103, wherein the system 10 of providing power may be provided on a mainboard, the preceding-stage power supply module 101 is electrically connected to the post-stage power supply module 102, and the post-stage power supply module 102 is electrically connected to the load 103. There may be one or more post-stage power supply modules, which is not limited in the present disclosure.

A projection on the mainboard of the smallest envelope area 104, which is formed by the contour lines of the preceding-stage power supply module 101 and the load 103, at least partially overlaps with a projection of the post-stage power supply module on the mainboard. The projection on the mainboard of the smallest envelope area 104, which is formed by the contour lines of the preceding-stage power supply module 101 and the load 103, includes a projection of the preceding-stage power supply module on the mainboard, a projection of the load on the mainboard, and a projection on the mainboard of an area which is formed by the connection lines of the contours of the preceding-stage power supply module and the load, as shown by the trapezoid defined by the two oblique dotted lines.

In some embodiments, taking the system 10 of providing power shown in FIG. 1 as an example, the projection of the post-stage power supply module 102 on the mainboard may be within the smallest envelope area 104, which is formed by the contour lines of the preceding-stage power supply module 101 and the load 103.

The preceding-stage power supply module 101 may be one with a length of L1 and a width of W1; the post-stage power supply module 102 may be, for example, two, with a length of L2 and a width of W2; the distance from the preceding-stage power supply module 101 to the load 103 is D1+W2+D2, which is greater than the distance D2 from the post-stage power supply module 102 to the load 103. The area occupied by the preceding-stage power supply module 101 may be larger than the area occupied by the post-stage power supply module 102, that is, L1*W1>L2*W2.

It should be noted that the number of the preceding-stage power supply module, the post-stage power supply module and the load may be set as needed, which is not limited in the present disclosure.

As shown in FIG. 2, the preceding-stage power supply module 101 may include a plurality of sets of preceding-stage output pins VO1 and preceding-stage ground pins GND1. The preceding-stage output pins VO1 and the preceding-stage ground pins GND1 are alternately arranged to form a first rectangular envelope area 201, and the first rectangular envelope area 201 is as shown by thick dashed rectangular area in FIG. 2.

Further, in some embodiments, the preceding-stage output pins VO1 and the preceding-stage ground pins GND1 are alternately arranged along a direction of a straight line 203 where a long side of the first rectangular envelope area 201 is located.

The preceding-stage output pins VO1 and the preceding-stage ground pins GND1 are alternately arranged, which can make the preceding-stage power supply module realize better current sharing effect.

It should be noted that the staggered arrangement of the preceding-stage output pins VO1 and the preceding-stage ground pins GND1 may be arranged at an equal interval, or may be arranged at an unequal interval.

Further, the load 103 may be disposed on a side of the long side of the first rectangular envelope area 201. The load 103 includes a load input pin VIN3 and a load ground pin GND3. The load input pin VIN3 and the load ground pin GND3 form a second rectangular envelope area 202, and the center line 204 of the first rectangular envelope area 201 and the second rectangular envelope area 202 is perpendicular to a straight line 203 where the long side of the first rectangular envelope area 201 is located. The load input pin VIN3 and the load ground pin GND3 may be one set or a plurality of sets. It should be noted that the shape of the load input pin VIN3 and the load ground pin GND3 are not limited to the rectangular structure shown in FIG. 2 but may also be an irregular shape structure; and the arrangement of the load input pin VIN3 and the load ground pin GND3 is not limited to the arrangement shown in FIG. 2, which is not limited here.

Further, the center line 204 of the first rectangular envelope area 201 and the second rectangular envelope area 202 is perpendicular to the straight line 203 where the long side of the first rectangular envelope area 201 is located, which may meet a certain angular tolerance, and the tolerance may be +/−10 degrees. That is to say, the angle between the center line 204 and the straight line 203 may be 80 degrees to 100 degrees. The tolerance may include a processing deviation of a power pad corresponding to the first rectangular envelope area 201, a processing deviation of a power pad corresponding to the second rectangular envelope area 202, and a welding deviation of the first rectangular envelope area 201 with respect to the mainboard and a welding deviation of the second rectangular envelope area 202 with respect to the mainboard, respectively.

The post-stage power supply module 102 includes at least one set of a post-stage input pin VIN2, a post-stage output pin VO2 and a post-stage ground pin GND2, the post-stage input pin VIN2, the post-stage output pin VO2 and the post-stage ground pin GND2 are arranged along the center line 204, and in a direction directed to the load.

Figure 3:
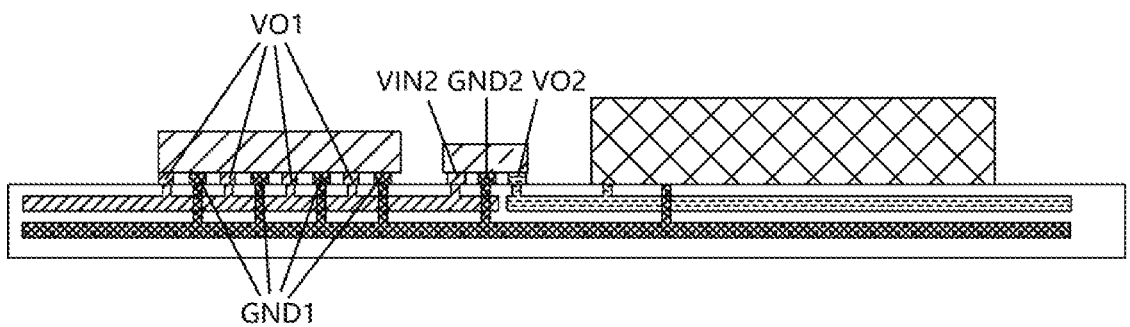
FIG. 3 is a schematic cross-sectional view of a system of providing power according to an exemplary embodiment.

FIG. 3 is a schematic cross-sectional view of a system of providing power according to an exemplary embodiment.

Figure 4:
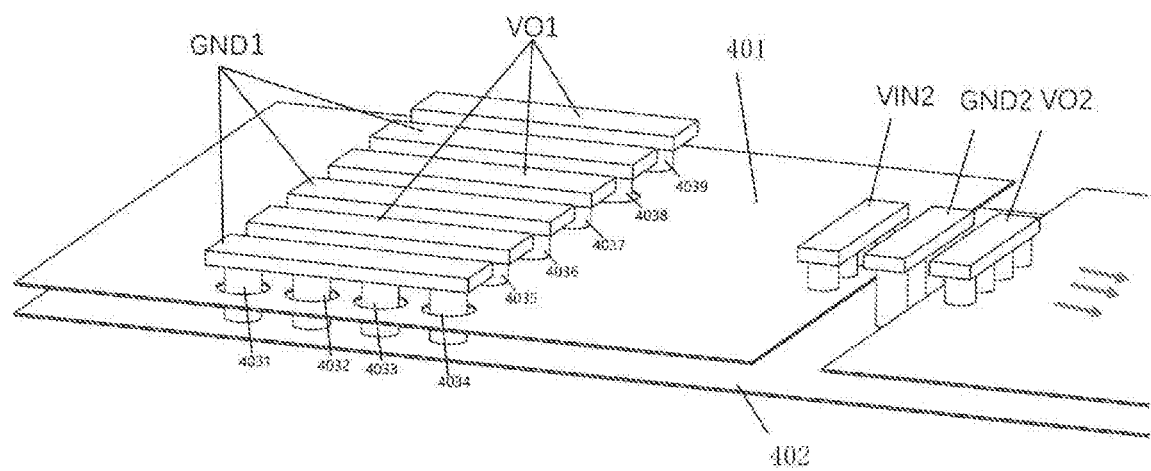
FIG. 4 is a schematic perspective view of a system of providing power according to an exemplary embodiment.

FIG. 4 is a schematic perspective view of a system of providing power according to an exemplary embodiment.

FIG. 3 is a vertical cross-sectional view along cross-sectional lines A1-A2, A3-A4 shown in FIG. 2.

As shown in FIG. 3 and FIG. 4, the preceding-stage output pins VO1 are connected to a first area of a first wiring layer 401 of the mainboard through a plurality of conductive pillars, and the preceding-stage ground pins GND1 are connected to a second wiring layer 402 of the mainboard through a plurality of conductive pillars.

The post-stage input pin VIN2 is connected to the first area of the first wiring layer 401 through a plurality of conductive pillars, the post-stage ground pin GND2 is connected to the second wiring layer 402 through a plurality of conductive pillars, and the post-stage output pin VO2 is connected to a second area of the first wiring layer 401 of the mainboard through a plurality of conductive pillars.

The load input pin is connected to the second area of the first wiring layer 401 through a plurality of conductive pillars, and the load ground pin is connected to the second wiring layer 402 through a plurality of conductive pillars.

In the embodiment of the present disclosure, the preceding-stage output pin VO1 of the preceding-stage power supply module is electrically connected to the post-stage input pin VIN2 of the post-stage power supply module through the first area of the first layer wiring 401 of the mainboard, and the preceding-stage ground pin GND1 of the preceding-stage power supply module is electrically connected to the post-stage ground pin GND2 through the second wiring layer 402 of the mainboard. For example, the preceding-stage power supply module is an LLC circuit, and a current of the preceding-stage output pin VO1 is greater than a current of the preceding-stage ground pin GND1. Therefore, the connection between the preceding-stage output pin VO1 and the first wiring layer of the mainboard may realize the shortest path, thereby reducing the transmission loss.

In some embodiments, both the first wiring layer 401 and the second wiring layer 402 may be metal wiring layers. Optionally, both the preceding-stage power supply module and the post-stage power supply module may be connected to the mainboard through conductive pillars, one end of each conductive pillar is connected to a module substrate, and the other end of the conductive pillar is connected to the mainboard.

In some embodiments, the contact surfaces of pins of the preceding-stage power supply module and the post-stage power supply module with the mainboard are wavy surfaces. In some embodiments, a terminal surface of the conductive pillar may be a wavy surface, or two terminal surfaces of the conductive pillar may be all wavy surface. It should be noted that the welding surface of the conductive pillar may be a flat surface as well. The welding surface is a wavy surface, which may make welding more stable and reduce welding voids.

In some embodiments, the preceding-stage output pin and/or the preceding-stage ground pin are bonded together by a plastic part. For example, the preceding-stage output pins may be bonded together by a plastic part, the preceding-stage ground pins may be bonded together by a plastic part, or the preceding-stage output pins and preceding-stage ground pins may be bonded together by a plastic part.

In the embodiment of the present disclosure, bonding the above-mentioned pins into a whole through a plastic part may increase the stability of the structure during welding, and the pins are covered with an insulating material, which may effectively improve the connection strength between the module substrate and the mainboard, and better resist external shocks, such as vibration and drop during transportation or use.

In some embodiments, the power of a single preceding-stage power supply module is greater than the power of a single post-stage power supply module. As shown in FIG. 3, the height of the preceding-stage power supply module is generally higher than that of the post-stage power supply module.

In the embodiment of the present disclosure, the preceding-stage power supply module may receive a first DC voltage from the mainboard through the preceding-stage input pin. The first DC voltage may be, for example, 400V, 48V, 12V. After flowing through the preceding-stage power supply, a second DC voltage may be output through the preceding-stage output pin VO1, and the second DC voltage may be, for example, 48V, 12V, or 6V The first DC voltage is greater than the second DC voltage. The post-stage power supply module may receive the second DC voltage output from the preceding-stage power supply module from the mainboard through the post-stage input pin VIN2, and after flowing through the post-stage power supply module, a third DC voltage is output through the post-stage output pin VO2. The third DC voltage may be, for example, 2V The third DC voltage is transmitted to the load through the mainboard, and the power flows in the direction of the arrow shown in FIG. 4.

As shown in FIG. 4, taking conductive pillars in the system mainboard corresponding to the first rectangular envelope area of the preceding-stage power supply module as an example, a short-side direction of the first rectangular envelope area includes four conductive pillars 4031, 4032, 4033 and 4034, and the long-side direction of the first rectangular envelope area includes six conductive pillars 4034, 4035, 4036, 4037, 4038 and 4039. The four conductive pillars 4031, 4032, 4033 and 4034 connected to the second wiring layer 402 through four conductive holes. The distances from the conductive pillars 4034, 4035, 4036, 4037, 4038, 4039 to the post-stage power supply module are approximately equal. The distances from the conductive pillars 4031, 4032, 4033, 4034 to the post-stage power supply module are different, which may increase the transmission impedance along with the distance increasing. It may be known that the distances from the conductive pillars 4034, 4035, 4036, 4037, 4038, 4039 to the post-stage power supply module are approximately equal, so that impedances of the preceding-stage power supply module connected to the post-stage power supply module through the conductive pillars 4034, 4035, 4036, 4037, 4038, and 4039 are approximately the same, thereby realizing that the distance from the preceding-stage power supply module to the post-stage power supply module is the shortest, and the impedance is the smallest.

It should be noted, in FIG. 4, the conductive pillars are cylindrical, in some embodiments, the conductive pillars may be rectangular. In this disclosure, the shape and structure of conductive pillars are not limited. In some embodiments, the conductive pillars may even be the solder that connects the pins of the module and the mainboard.

In the embodiment of the present disclosure, the post-stage power supply module and the load are both disposed on a side of the long side of the first rectangular envelope area composed of the preceding-stage output pin VO1 and the preceding-stage ground GND1 of the preceding-stage power supply module, and such arrangement may reduce the difference in impedance caused by the distance from the conductive pillars 4031, 4032, 4033 and 4034 to the power supply module in the short side.

It can be seen with reference to FIG. 1, FIG. 2 and FIG. 4 that, in the embodiment of the present disclosure, the post-stage power supply module is disposed on a side of the long side of the first rectangular envelope area, so that the length of the transmission path from the preceding-stage power supply module to the post-stage power supply module may be approximately equivalent to W1+D1. However, if the post-stage power supply module and the load are arranged on a side of the short side of the first rectangular envelope area, the length of the transmission path may be approximately equivalent to L1+D1. W1+D1<L1+D1, therefore, compare with the arrangement of the post-stage power supply module and load disposed on a side of the short side of the first rectangular envelope area, the arrangement in the embodiment of the present disclosure has a shorter transmission path, and higher transmission efficiency.

In addition, the post-stage power supply module is completely located within the smallest envelope area 104, the post-stage input pin VIM, the post-stage ground pin GND2 and the post-stage output pin VO2 of the post-stage power supply module are arranged along the center line 204 in sequence, and the direction of arrangement is directed to the load, so that the current path from the preceding-stage power supply module to the post-stage power supply module and then to the terminal load may be further shortened, the transmission loss is further reduced, and the efficiency is further improved.

In the system of providing power according to the present disclosure, the projection on the mainboard of the smallest envelope area, which is formed by the contour lines of the preceding-stage power supply module and the load, at least partially overlaps with a projection of the post-stage power supply module on the mainboard, which can make the transmission distance from the preceding-stage power supply module to the post-stage power supply module and the post-stage power supply module to the load the shortest, thus reducing the transmission loss. The plurality of sets of the preceding-stage output pins and the preceding-stage ground pins of the preceding-stage power supply module are alternately arranged, which have a good current sharing effect. The preceding-stage output pins and the preceding-stage ground pins are alternately arranged to form the first rectangular envelope area. The load is disposed on the side of the long side of the first rectangular envelope area. The load input pin and the load ground pin form a second rectangular envelope area. A center line of the first rectangular envelope area and the second rectangular envelope area is perpendicular to a straight line where the long side of the first rectangular envelope area is located, which can shorten the connection distance that the preceding-stage power supply module is connected to the mainboard through the conductive pillars and then connected to the post-stage power supply module, and reduce the transmission loss.

Figure 5:
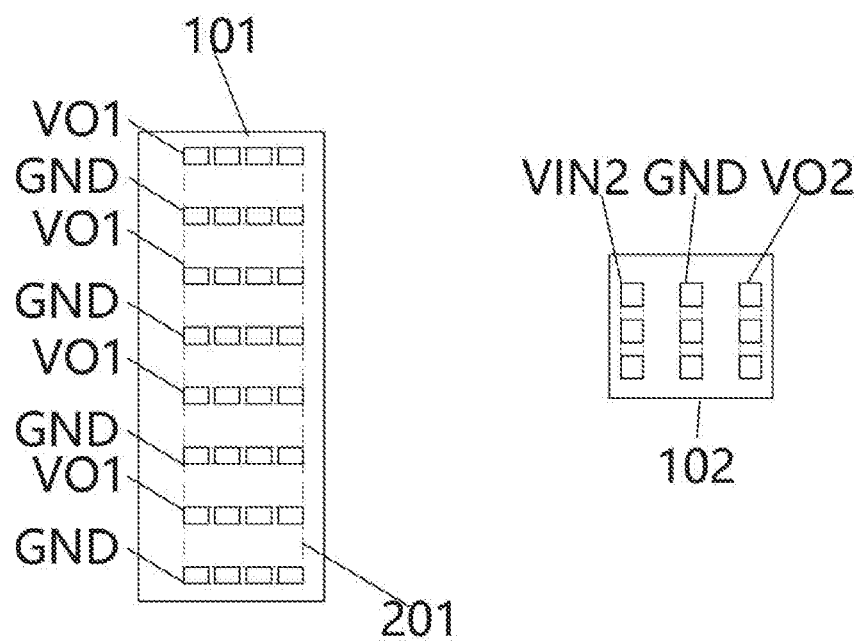
FIG. 5 is a structural schematic diagram of another system of providing power according to an exemplary embodiment.

FIG. 5 is a structural schematic diagram of another system of providing power according to an exemplary embodiment.

As shown in FIG. 5, in some embodiments, the preceding-stage output pins VO1 and the preceding-stage ground pins GND1 of the preceding-stage power supply module 101, the post-stage input pin VIN2, the post-stage ground pin GND2 and the post-stage output pin VO2 of the post-stage power supply module 102 may be composed of a plurality of small-sized pins. From the perspective of the entire arrangement of pins, a plurality of adjacent pins of the same potential may be regarded as the same one pin.

The preceding-stage power supply module 101 may include a plurality of sets of preceding-stage output pins VO1 and preceding-stage ground pins GND1, and the plurality of sets of preceding-stage output pins VO1 and preceding-stage ground pins GND1 are alternately arranged in a direction of the straight line 203 where the long side of the first rectangular envelope area 201 is located. The post-stage power supply module 102 includes at least one set of a post-stage input pin VIN2, a post-stage ground pin GND2 and a post-stage output pin VO2, the post-stage input pin VIN2, the post-stage ground pin GND2 and the post-stage output pin VO2 are arranged along a direction of the center line 204 of the first rectangular envelope area 201 and the second rectangular envelope area.

In the embodiment of the present disclosure, setting the pads to be a plurality of small pads may make welding more convenient and reduce the void ratio of the welding surface.

Figure 6:
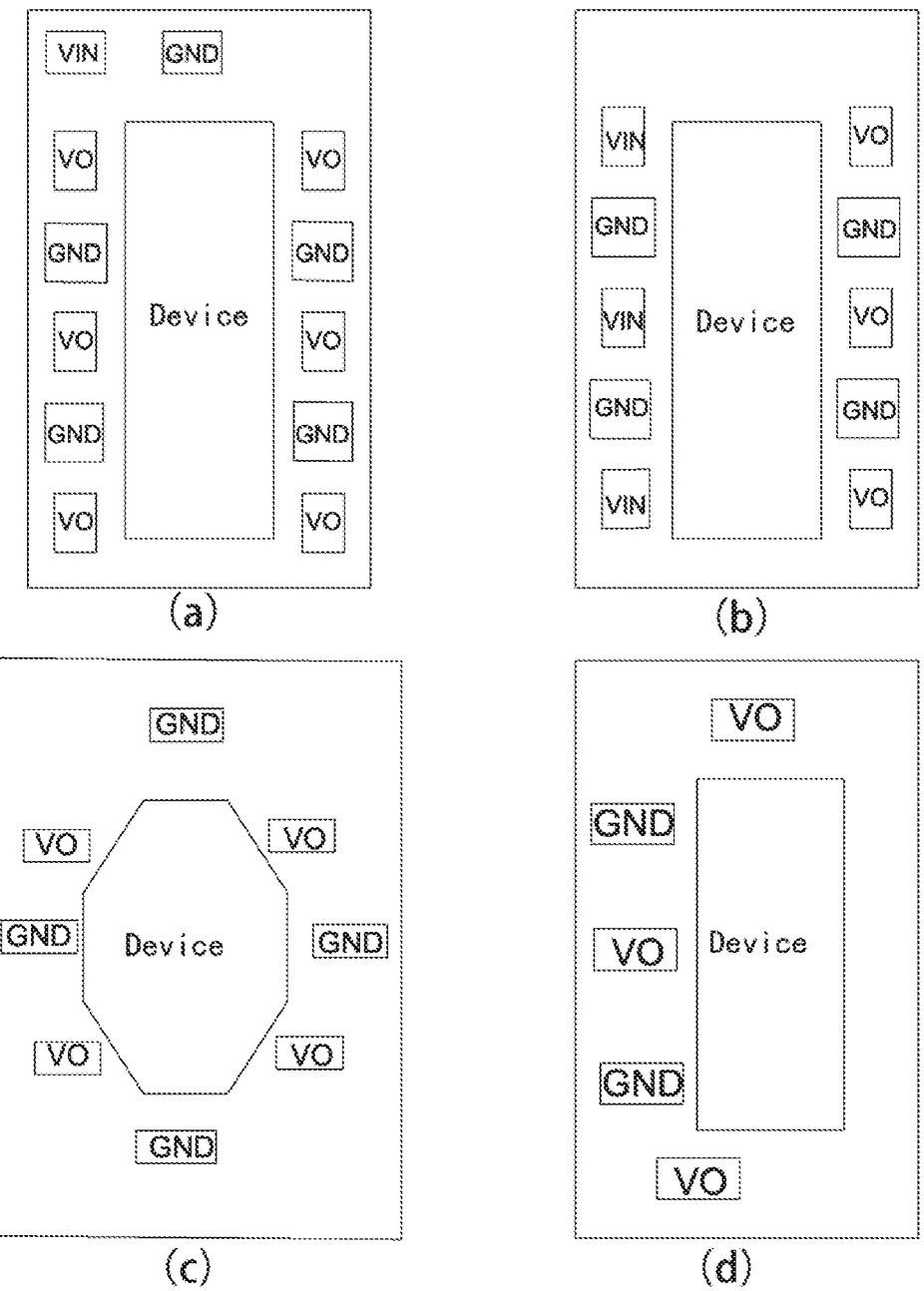
FIG. 6 is a schematic diagram of a pin arrangement of a preceding-stage power supply module according to an exemplary embodiment.

FIG. 6 is a schematic diagram of a pin arrangement of a preceding-stage power supply module according to an exemplary embodiment.

As shown in FIG. 6, in some embodiments, the preceding-stage power supply module further includes a power electronic device, and the preceding-stage output pin VO1 and the preceding-stage ground pin GND1 of the preceding-stage power supply module are alternately arranged around the power electronic device. The power electronic device may be, for example, a magnetic core, or other devices, which is not limited in this disclosure, and is referred to as a device hereinafter.

Optionally, as shown in of FIG. 6, the preceding-stage output pins VO1 and the preceding-stage ground pins GND1 are alternately arranged along the long sides of the device, and the pins are symmetrically distributed on both sides of the device. In some embodiments, the preceding-stage power supply module further includes a preceding-stage input pin VIN1 and a preceding-stage ground pin GND1, which are disposed on a short side of the preceding-stage power supply module.

Optionally, as shown in (b) of FIG. 6, the preceding-stage output pins VO1 and the preceding-stage ground pins GND1 are located on one side of the device and are alternately arranged along the long side of the device, and the preceding-stage input pins VIN1 and the preceding-stage ground pins GND1 are located on the other side of the device and are alternately arranged along the long side of the device.

Optionally, as shown in (c) of FIG. 6, the preceding-stage output pins VO1 and the preceding-stage ground pins GND1 are distributed around the device, as mentioned above, the pins of the same electrode are equivalent to one pin, so the preceding-stage output pins VO1 and the preceding-stage ground pins GND1 are alternately arranged along the perimeter of the device.

Optionally, as shown in (d) of FIG. 6, some of the preceding-stage output pins VO1 and the preceding-stage ground pins GND1 are alternately arranged along a long side of the device, and some of the preceding-stage output pins VO1 and the preceding-stage ground pins GND1 partially are interleaved or are not interleaved along the short sides of the device.

Figure 7:
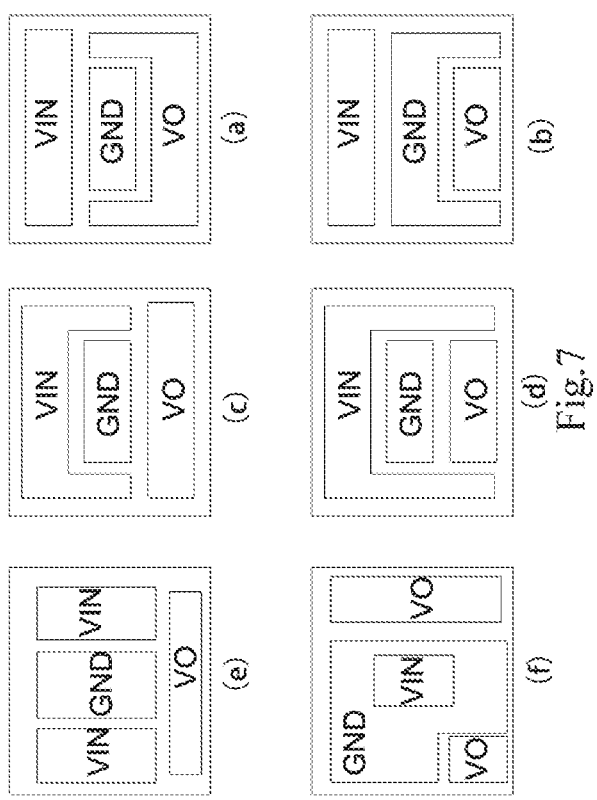
FIG. 7 is a schematic diagram of a pin arrangement of a post-stage power supply module according to an exemplary embodiment.

FIG. 7 is a schematic diagram of a pin arrangement of a post-stage power supply module according to an exemplary embodiment.

As shown in FIG. 7, in some embodiments, the distance from the post-stage input pin VIN2 to the preceding-stage power supply module or the distance from the post-stage ground pin GND2 to the preceding-stage power supply module is less than the distance from the post-stage output pin VO2 to the preceding-stage power supply module.

Optionally, as shown in (a) or (b) of FIG. 7, the post-stage output pin VO2 and the post-stage ground pin GND2 have interleaving in directions of the cross-sections of both the long side and the short side of the post-stage power supply module. That is, it may be looked as that the post-stage output pin VO2 partially surrounds the post-stage ground pin GND2, or the post-stage ground pin GND2 partially surrounds the post-stage output pin VO2.

Optionally, as shown in (c) or (d) of FIG. 7, the post-stage output pin VO2 and the post-stage ground pin GND2 are not interleaved, in the direction of the cross-section of the short side of the post-stage power supply module, but the post-stage input pin VIN2 and the post-stage ground pin GND2, or, the post-stage input pin VIN2 and the post-stage output pin VO2 have partial interleaving. That is, it may be looks as that the post-stage input pin VIN2 partially surrounds the post-stage ground pin GND2, or the post-stage input pin VIN2 partially surrounds both the post-stage ground pin GND2 and the post-stage output pin VO2.

Optionally, as shown in (e) of FIG. 7, the post-stage ground pin GND2 and the post-stage input pin VIN2 are alternately arranged, and the long side of the post-stage output pin VO2 is parallel with the arrangement direction of the post-stage ground pin GND2 and the post-stage input pin VIN2, and is disposed on the edge of the post-stage module near the load.

As shown in (f) of FIG. 7, the post-stage input pin VIN2 is surrounded by the post-stage ground pin GND2.

It can be seen from (a) to (f) of FIG. 7 that the post-output pin VO2 of the post-stage power supply module may be disposed at the edge of the post-stage power supply module and is not surrounded by the post-stage input pin VIN2 or the post-stage ground pin GND2.

Figure 8:
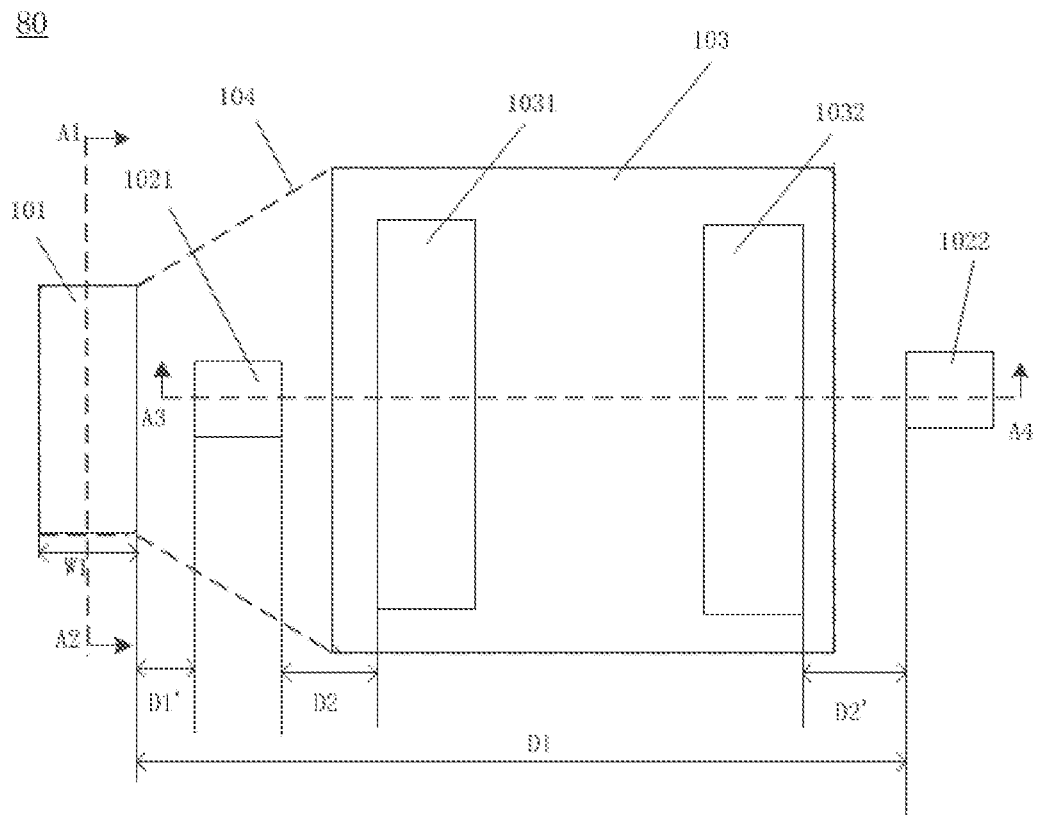
FIG. 8 is a structural schematic diagram of another system of providing power according to an exemplary embodiment.

FIG. 8 is a structural schematic diagram of another system of providing power according to an exemplary embodiment.

Figure 9:
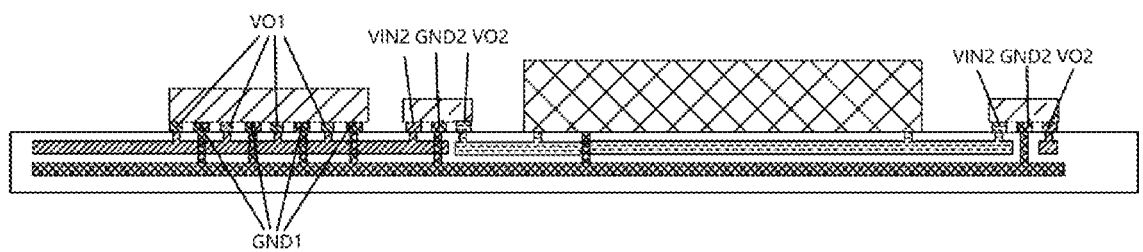
FIG. 9 is a schematic cross-sectional view of the system of providing power according to the power supply system shown in FIG. 8.

FIG. 9 is a schematic cross-sectional view of the system of providing power according to the power supply system shown in FIG. 8, FIG. 9 is a vertical cross-sectional view along the lines A1-A2 and A3-A4 shown in FIG. 8.

Figure 10:
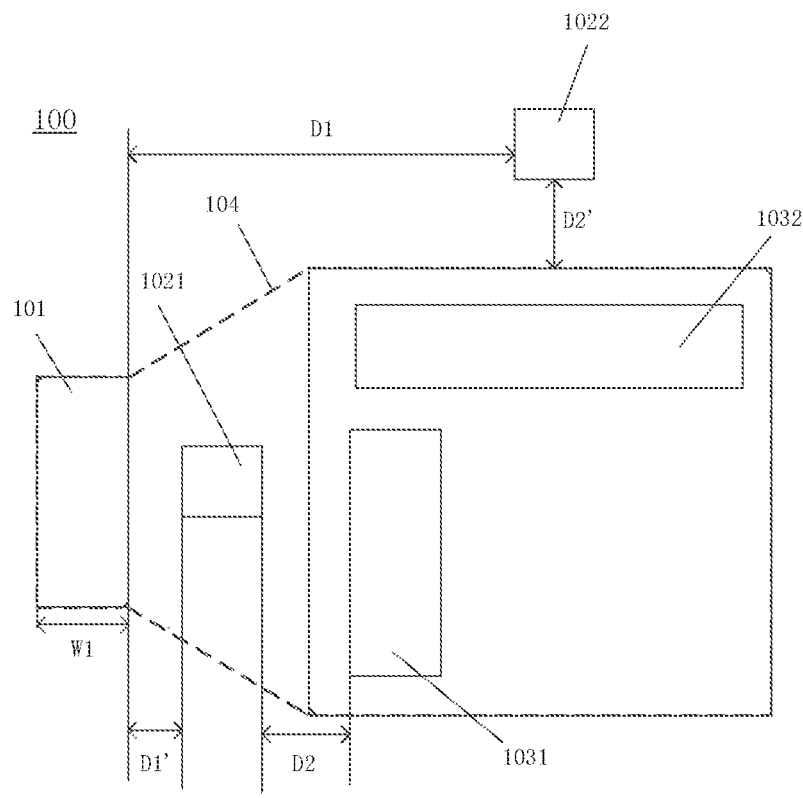
FIG. 10 is a structural schematic diagram of another system of providing power according to an exemplary embodiment.

FIG. 10 is a structural schematic diagram of another system of providing power according to an exemplary embodiment.

As shown in FIG. 8 and FIG. 10, both the power supply system 80 and the power supply system 100 respectively include the preceding-stage power supply module 101, a post-stage power supply module and a load, the post-stage power supply module includes a first post-stage power supply module 1021 and a second post-stage power supply module 1022, and the load includes a chip which may be a multi-core chip. Taking the chip including two cores as an example, the chip includes a first core 1031 and a second core 1032, the first post-stage power supply module 1021 is electrically connected to the first core 1031 of the chip to provide power for it, and the second post-stage power supply module 1022 is electrically connected to the second core 1032 of the chip to provide power for it.

The first post-stage power supply module 1021 is disposed within the smallest envelope area 104 which is formed by the contour lines of the preceding-stage power supply module 101 and the load 103, the first post-stage power supply module 1021 is close to the first core 1031, and the second post-stage power supply module 1022 is close to the second core 1032.

The power supply system 80 shown in FIG. 8 is different from the system 10 shown in FIG. 1 in that the two post-stage power supply modules are located on two opposite sides of the load respectively, for example, the left and right sides of the load.

The power supply system 100 shown in FIG. 10 is different from the power supply system 80 shown in FIG. 8 in that the first post-stage power supply module is located on one sides of the load, for example, the left side of the load, and the second post-stage power supply module is located on an adjacent side of the load, for example, the upper side of the load. By setting the post-stage power supply modules at different positions of the chip, it may better provide power to a plurality of cores of the chip.

As in this embodiment, the projection on the mainboard of the smallest envelope area 104, which is formed by the contour lines of the preceding-stage power supply module and the load, partially overlaps with the projection of the post-stage power supply module on the mainboard.

In the power supply system 80 shown in FIG. 8 and the power supply system 100 shown in FIG. 10, the second post-stage power supply module 1022 is located close to the second core 1032 of the load, that is, the distance D2' from the second post-stage power supply module 1022 to the second core 1032 of the chip is approximately equal to the distance D2 from the first post-stage power supply module 1021 to the first core 1031 of the chip, so that the output current of the second post-stage power supply module 1022 may reach the second core 1032 on the right, without flowing through the length of the entire load, which may greatly reduce power transmission loss between the post-stage power supply module and the load.

In the power supply system 80 shown in FIG. 8 and the power supply system 100 shown in FIG. 10, the load is the multi-core chip, including at least two cores, such as a multi-core processor chip.

As shown in FIG. 8 and FIG. 9, the first post-stage power supply module 1021 may provide a third DC voltage to the first core 1031 of the load, and the second post-stage power supply module 1022 may provide a fourth DC voltage to the second core 1032 of the load. The third DC voltage and the fourth DC voltage may be the same or different from each other. For example, the processor chips used in a data center are usually multi-core processors with powerful computing capability, wherein each processor chip contains multiple computing cores. The physical composition of each core is relatively independent, and its power supply may be independent from each other as well. The optimal voltage for each core may be provided according to practical work processed by different cores, that is, the third DC voltage and the fourth DC voltage may be unequal, so that the performance and power consumption ratio of the chip of the load may be optimized.

Figure 11:
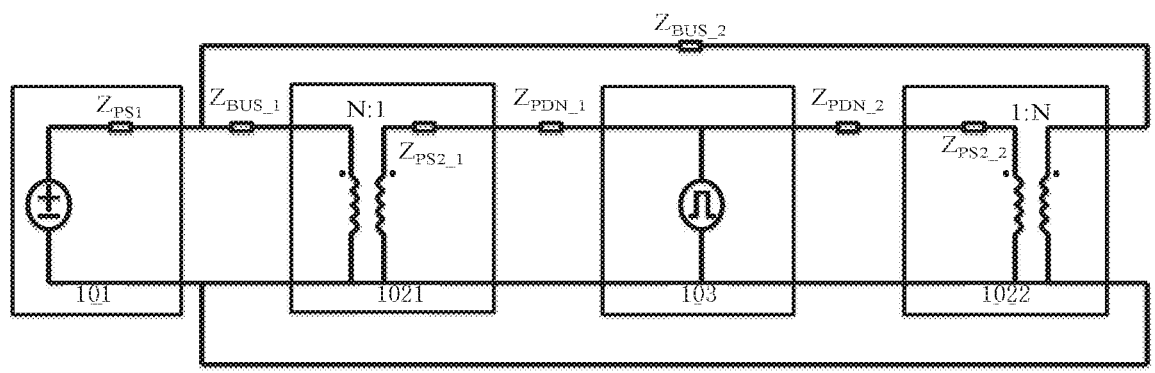
FIG. 11 is an equivalent circuit diagram of the system of providing power according to the power supply system shown in FIG. 8 and FIG. 10.

FIG. 11 is an equivalent circuit diagram of the system of providing power according to the power supply system shown in FIG. 8 and FIG. 10.

As is apparently seen from FIG. 8 and FIG. 10, the distance from the preceding-stage power supply module 101 to the first post-stage power supply 1021 and the distance from the preceding-stage power supply module 101 to the second post-stage power supply 1022 is asymmetric, so that the impedance between the preceding-stage power supply module 101 and the second post-stage power supply module 1022 farther from the impedance between the preceding-stage power supply module 101 and the first post-stage power supply module 1021. That is, the impedance $Z_{BUS\_2}$ of the middle low-voltage bus in FIG. 11, is greater than the impedance $Z_{BUS\_1}$ of the middle low-voltage bus between the preceding-stage power supply module 101 and the first post-stage power supply 1021 in FIG. 11. Based on the equivalent circuit shown in FIG. 11, the overall impedance of the power supply structure shown in FIG. 1 and FIG. 10 may be derived as:

$$Z=Z_{PS1}/N^2+(Z_{BUS\_1}/N^2+Z_{PS2\_1}+Z_{PDN\_1})//(Z_{BUS\_1}/N^2+Z_{PS2\_2}+Z_{PDN\_2}),$$

wherein the operation symbol "//" represents a parallel connection of impedances, $Z_{PS1}$ is an equivalent output impedance of the preceding-stage power supply module 101, $Z_{BUS\_1}$ is an impedance of the middle low-voltage bus of the preceding-stage power supply module 101 and the first post-stage power supply module 1021, $Z_{BUS\_2}$ is the impedance of the middle low-voltage bus of the preceding-stage power supply module 101 and the second post-stage power supply module 1022, $Z_{PS2\_1}$ is an equivalent output impedance of the first post-stage power supply module 1021, $Z_{PS2\_2}$ is an equivalent output impedance of the second post-stage power supply module 1022, $Z_{PDN\_1}$ is the transmission impedance between the first post-stage power supply module 1021 and the load 103, and $Z_{PDN\_2}$ is the transmission impedance between the second post-stage power supply module 1022 and the load 103.

The first post-stage power supply 1021 and the second post-stage power supply 1022 may be Buck (Buck Chopper) circuits, and the overall impedance of the power supply structure may be:

$$Z=Z_{PS1}*d^2+(Z_{BUS\_1}*d^2+Z_{PS2\_1}+ZPDN\_1)//(Z_{BUS\_2}*d^2+Z_{PS2\_2}+Z_{PDN\_2}),$$

wherein d is a duty ratio of the Buck circuit, and during a dynamic transition of the load, d≈1, therefore, the overall impedance of the power supply structure may be:

$$Z \approx Z_{PS1}+(Z_{BUS\_1}+Z_{PS2\_1}+Z_{PDN\_1})//(Z_{BUS\_2}+Z_{PS2\_2}+Z_{PDN\_2}),$$

When the implementation of the power supply structure shown in the present disclosure is adopted, $Z_{BUS\_2} \leq 5*(Z_{PS2\_2}+Z_{PDN\_2})$ be satisfied, such that advantages of high operating frequency and small size of the second post-stage power supply 1022 may be fully utilized. Moreover, the loss of steady-state transmission may be reduced, thereby improving the power supply efficiency of the system.

Figure 12:
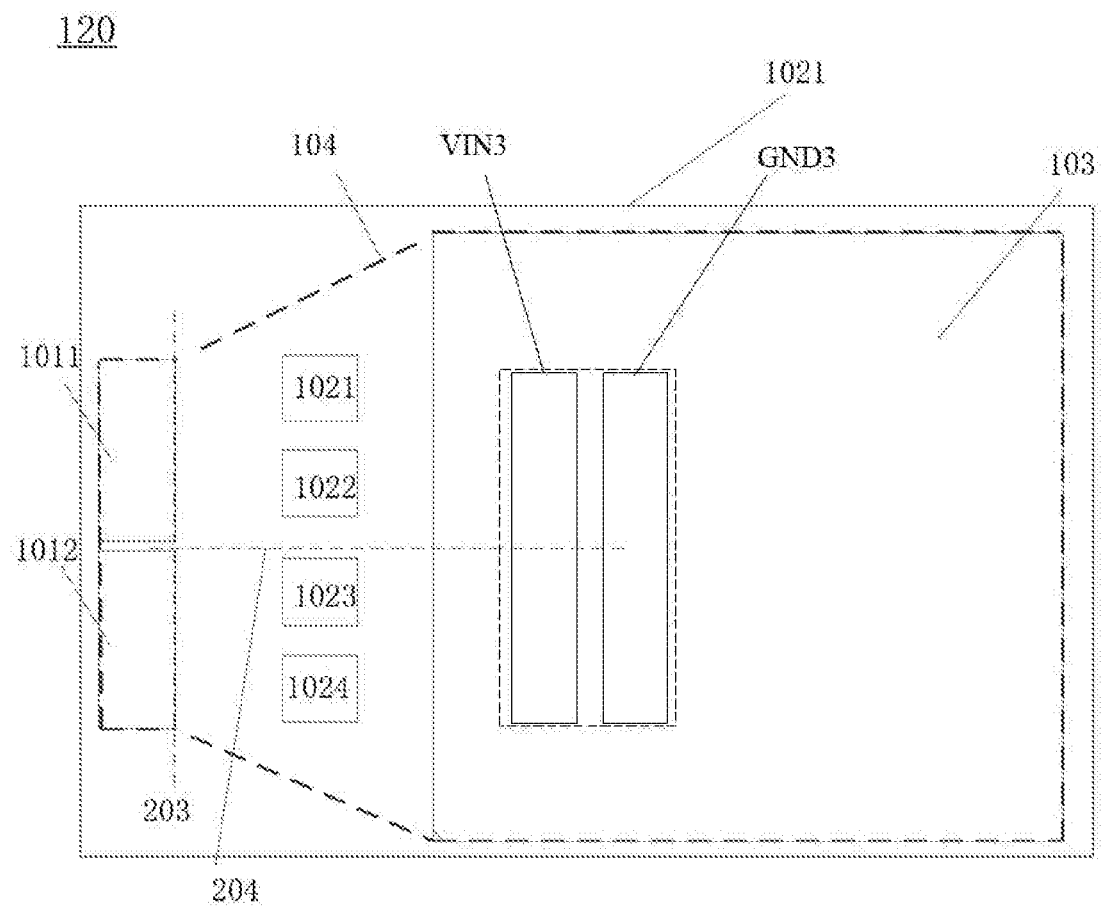
FIG. 12 is a structural schematic diagram of another system of providing power according to an exemplary embodiment.

FIG. 12 is a structural schematic diagram of another system of providing power according to an exemplary embodiment.

As shown in FIG. 12, the difference from the system 10 shown in FIG. 1 is that the system 120 includes a plurality of preceding-stage power supply modules, a plurality of post-stage power supply modules and a load. Taking two preceding-stage power supply modules 1011 and 1012 and four post-stage power supply modules 1021, 1022, 1023 and 1024 as examples, the four post-stage power supply modules 1021, 1022, 1023 and 1024 are disposed within the smallest envelope area 104 which is formed by the contour lines of the two preceding-stage power supply modules 1011, 1012 and the load 103. The load 103 is disposed on a side of the long side of the first rectangular envelope area formed by the preceding-stage output pins and the preceding-stage ground pins of the preceding-stage power supply module 1011, 1012. The load 103 includes the load input pin VIN3 and the load ground pin GND3, the load input pin VIN3 and the load ground pin GND3 form a second rectangular envelope area, and the center line 204 of the first rectangular envelope area and the second rectangular envelope area is perpendicular to the straight line 203 where the long side of the first rectangular envelope area is located.

The system of providing power shown in FIG. 12 may be applied in a scenario where the area occupied by the power supply around the load is limited. As shown in FIG. 12, if placement area 1201 of the power supply is given, one preceding-stage power supply module of the system 10 of providing power shown in FIG. 1 may be decomposed into two preceding-stage power supply modules, and the two post-stage power supply modules are decomposed into four post-stage power supply modules, then they output in parallel. By this setting method, on one hand, after one channel is divided into two channels in parallel, power of each module becomes ½ of original power, total impedance after parallel connection will be reduced as well, and then the loss will be reduced and the efficiency will be improved; on the other hand, since a plurality of preceding-stage power supply modules and a plurality of post-stage power supply modules are disposed, and the size of each module in the plurality of preceding-stage power supply modules is small, the module may be placed more freely in a limited space.

Figure 13:
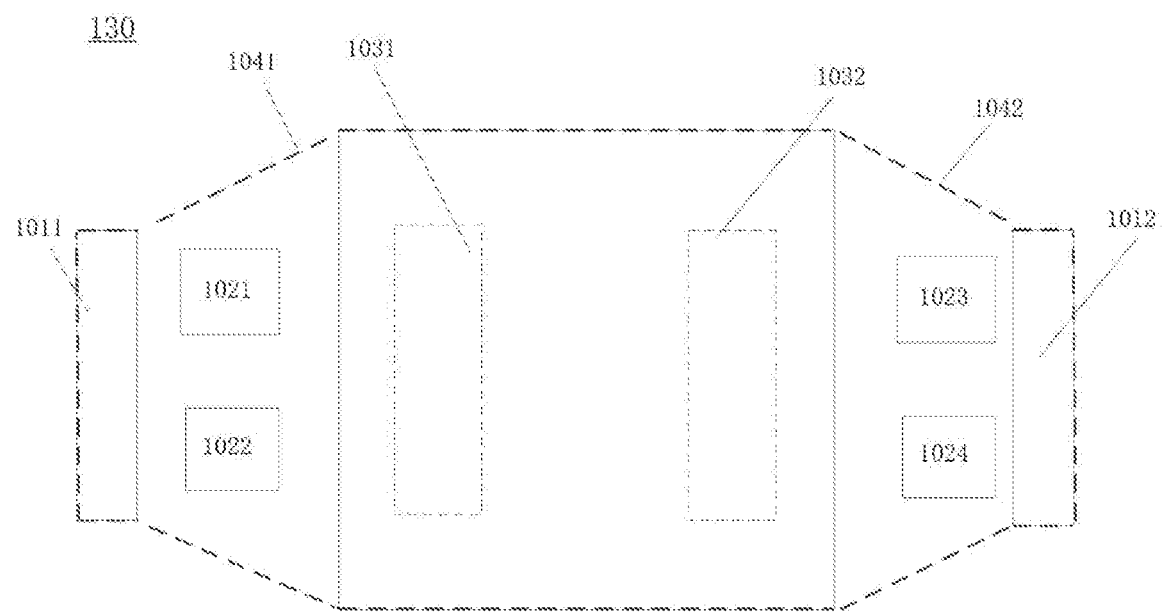
FIG. 13 is a structural schematic diagram of another system of providing power according to an exemplary embodiment.

FIG. 13 is a structural schematic diagram of another system of providing power according to an exemplary embodiment.

As shown in FIG. 13, the difference from the system 10 of providing power shown in FIG. 1 is that the system 130 of providing power includes a plurality of preceding-stage power supply modules, a plurality of post-stage power supply modules and a load. The load includes a chip, and the chip is a multi-core chip. Taking two preceding-stage power supply modules, four post-stage power supply modules and a two-core chip as an example, the preceding-stage power supply module includes a first preceding-stage power supply module 1011 and a second preceding-stage power supply module 1012, the post-stage power supply module includes a first post-stage power supply module 1021, a second post-stage power supply module 1022, a third post-stage power supply module 1023 and a post-stage power supply module 1024, and the chip includes a first core 1031 and a second core 1032. The first post-stage power supply module 1021 and the second post-stage power supply module 1022 are disposed within a smallest envelope area 1041 which is formed by the contour lines of the first preceding-stage power supply module 1011 and the load, the third post-stage power supply module 1023 and the fourth post-stage power supply module 1024 are disposed within the smallest envelope area 1042 which is formed by the contour lines of the second preceding-stage power supply module 1012 and the load, the first post-stage power supply module 1021 and the second post-stage power supply module 1022 are close to the first core 1031, and the third post-stage power supply module 1023 and the fourth post-stage power supply module 1024 are close to the second core 1032.

Figure 14:
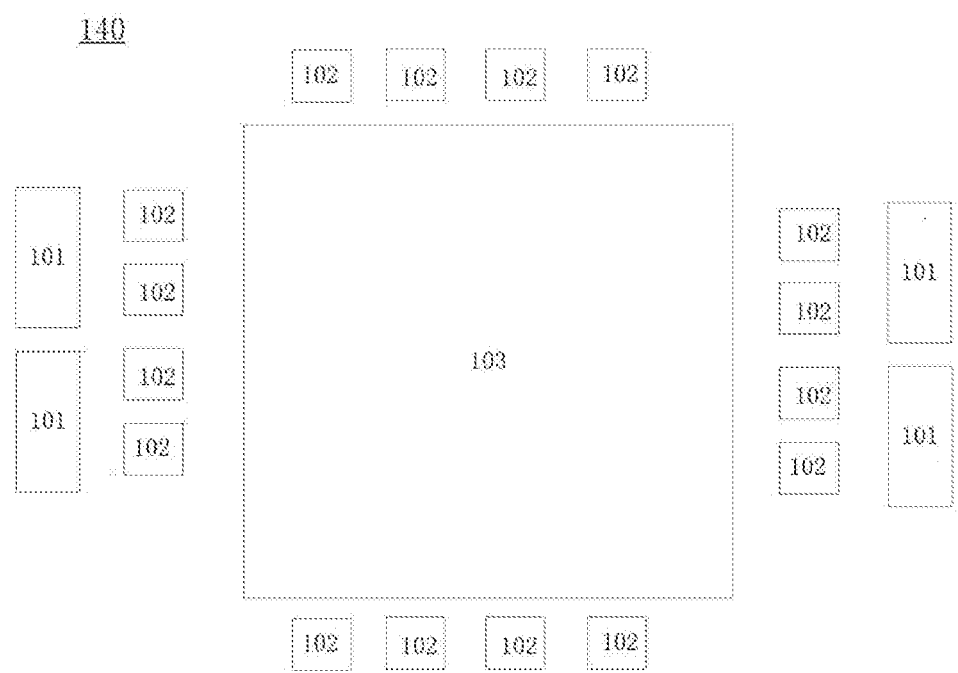
FIG. 14 is a structural schematic diagram of another system of providing power according to an exemplary embodiment.

FIG. 14 is a structural schematic diagram of another system of providing power according to an exemplary embodiment.

As shown in FIG. 14, it differs from the system 10 of providing power shown in FIG. 1 in that the system 140 of providing power includes a plurality of preceding-stage power supply modules 101 and a plurality of post-stage power supply modules 102. The system 140 of providing power may be applied, for example, in applications where the load requires high power. The plurality of preceding-stage power supply modules 101 are respectively disposed on the opposite two sides of the load 103, for example, the left and right sides, and the plurality of post-stage power supply modules 102 are disposed on the four sides of the load 103. The projection of the post-stage power supply modules 102 on the mainboard partially overlaps with the projection on the mainboard of the smallest envelope area which is formed by the contour lines of the preceding-stage power supply modules 101 and the load 103.

Figure 15:
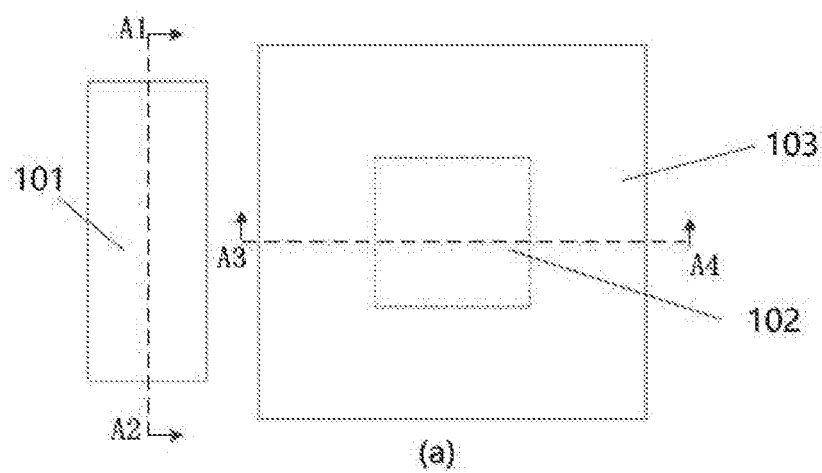
FIG. 15 is a structural schematic diagram of another system of providing power according to an exemplary embodiment.
Figure 15:
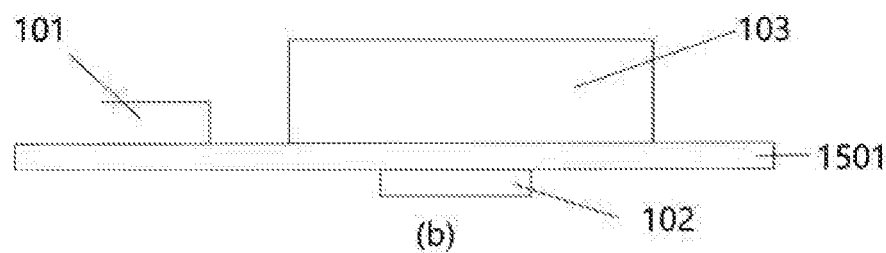

FIG. 15 is a structural schematic diagram of another system of providing power according to an exemplary embodiment.

As shown in FIG. 15, it differs from the system 10 of providing power shown in FIG. 1 is that, in the system 150 of providing power, the preceding-stage power supply module 101 and the load 103 are disposed on the same side of the mainboard 1501, the post-stage power supply module 102 and the load 103 are disposed on different sides of the mainboard 1501, and the projection of the post-stage power supply module 102 on the mainboard 1501 is within the projection of the load 103 on the mainboard 1501. FIG. 15 (*a*) is a schematic top view of the system 150 of providing power, FIG. 15 (*b*) is a schematic side view of the system 150 of providing power, and FIG. 15 (*b*) is a vertical cross-sectional view taken along the A1-A2 and A3-A4 section lines shown in FIG. 15 (*a*).

In the system 150 of providing power shown in FIG. 15, the distance between the preceding-stage power supply module 101 and the load 103, and the distance between the post-stage power supply module 102 and the load 103 may be shortened, the transmission path is shortened, and the transmission efficiency is improved.

Figure 16:
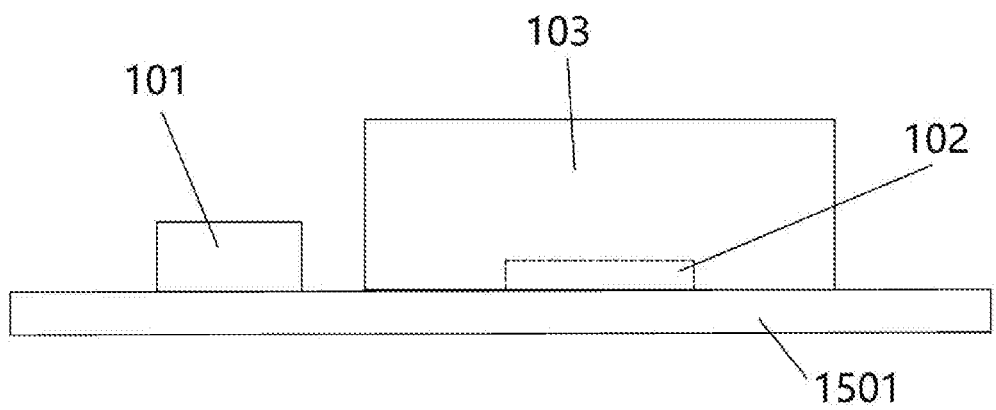
FIG. 16 is a structural schematic diagram of another system of providing power according to an exemplary embodiment.

FIG. 16 is a structural schematic diagram of another system of providing power according to an exemplary embodiment.

Figure 17:
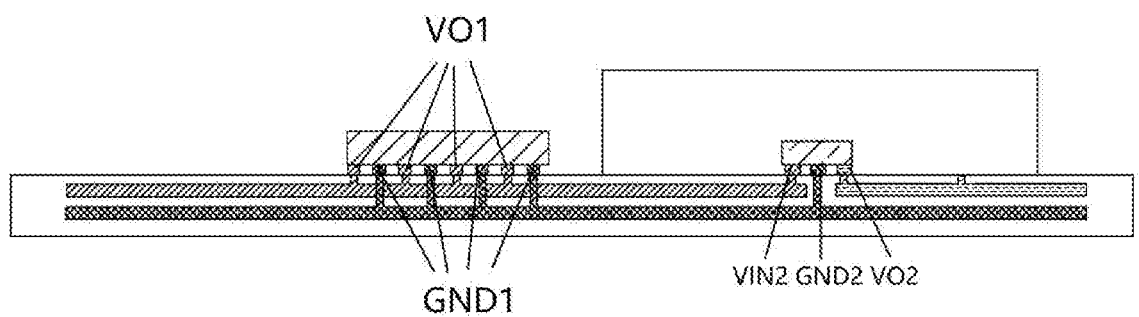
FIG. 17 is a schematic cross-sectional view of the system of providing power according to the system of providing power shown in FIG. 16.

FIG. 17 is a schematic cross-sectional view of the system of providing power according to the system of providing power shown in FIG. 16.

As shown in FIG. 16 and FIG. 17, it differs from the system 10 of providing power shown in FIG. 1 is that, in the system 160 of providing power, the preceding-stage power supply module 101, the post-stage power supply module 103 and the load 102 are disposed on the same side of the mainboard 1501. The projection of the post-stage power supply module 102 on the mainboard 1501 is within the projection of the load 102 on the mainboard 1501.

In the system 160 of providing power shown in FIG. 16, the post-stage power supply module 102 is disposed between the load 103 and the mainboard 1501, that is to say, the post-stage power supply module 102 is disposed under the load 103, which may shorten the distance between the preceding-stage power supply module 101 and the load 103, and distance between the post-stage power supply module 102 and the load 103, shorten the transmission path, and improve transmission efficiency.

The pins of each power supply module in FIG. 15-FIG. 17 may be referred to the pin distribution of the above-mentioned embodiments, which will not be expanded here.

Figure 18:
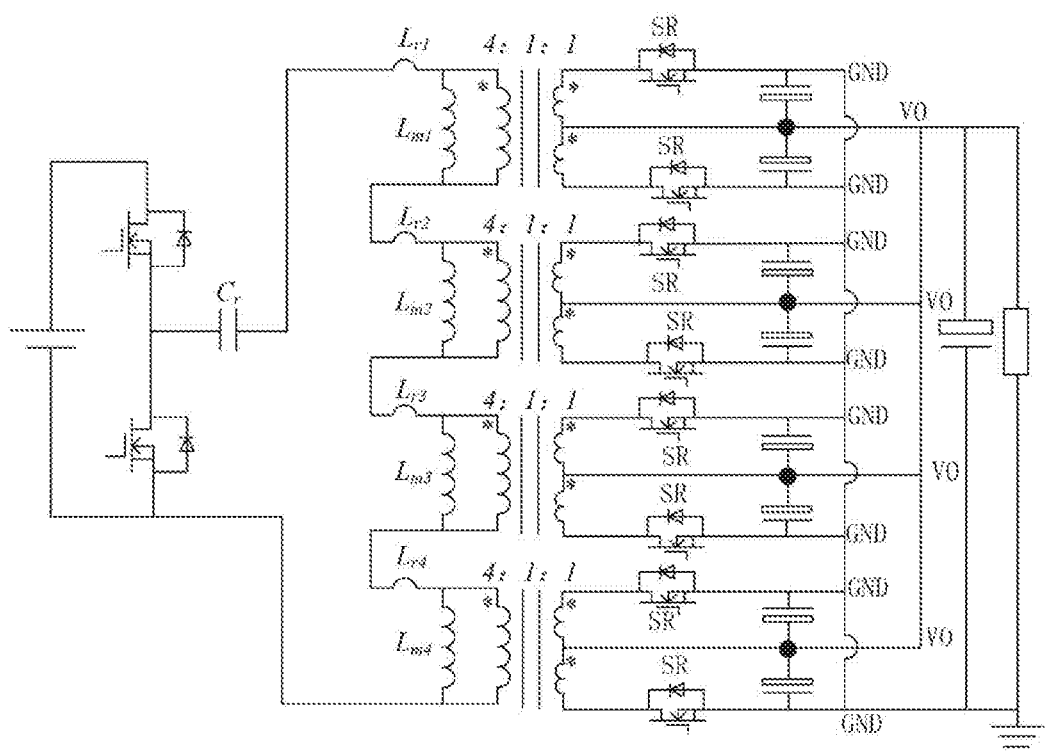
FIG. 18 is an equivalent circuit diagram of a matrix LLC converter according to an exemplary embodiment.

FIG. 18 is an equivalent circuit diagram of a matrix LLC converter according to an exemplary embodiment.

In some embodiments, the preceding-stage power supply module may be an LLC converter, and the preceding-stage power supply module may be any circuit including a transformer, such as a flyback converter, a full-bridge circuit, and the like.

As shown in FIG. 18, the preceding-stage power supply module is, for example, a matrixed LLC converter, and its power pins VO and GND are arranged alternatively. This arrangement manner may matrix secondary rectifier devices SR of the transformer and may evenly distribute large secondary current to different secondary side rectifier devices SR. It can be seen from FIG. 18 that the matrixed LLC converter may output for example by four separate transformers, where the primary sides of the four separate transformers are connected in series, and the secondary sides of the four separate transformers are connected in parallel, thus the secondary side of each transformer may only have one rectifier diode, so each the current passing through the respective rectifier diodes may be the same, which may realize a good current sharing effect.

After the matrixed transformer is used, the termination point for adding all current may occur on the DC side, so there will be no AC loss. The matrixed transformer may have a plurality of output ports, and each secondary side rectifier device may be placed close to the output port, so leakage inductance of the secondary side and the loss on the output path are low. Considering that the matrixed transformer has many advantages, usually fire power output pins of the preceding-stage power supply module may be set to a plurality of scattered VO pins and GND pins, and connected to the post-stage power supply module after being in parallel.

Figure 19:
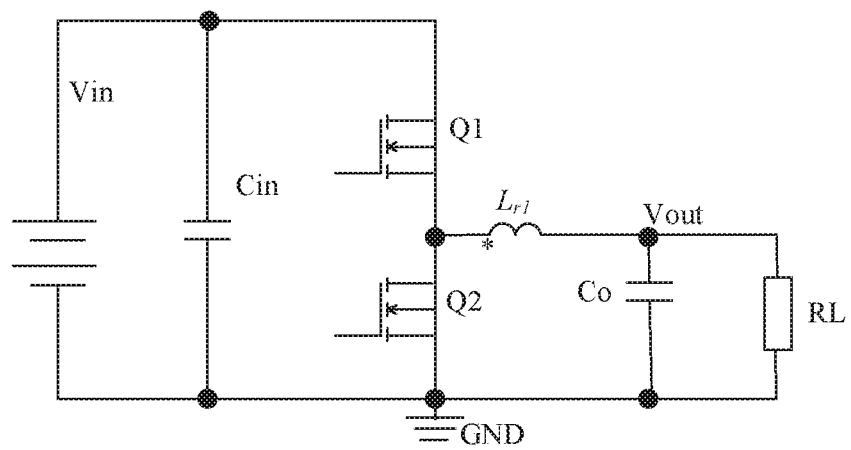
FIG. 19 is an equivalent circuit diagram of a matrix Buck according to an exemplary embodiment.

FIG. 19 is an equivalent circuit diagram of a matrix Buck according to an exemplary embodiment. In some embodiments, the post-stage power supply module may be a Buck circuit, or a full bridge circuit, etc., which is not limited in the present disclosure. The Vin pin and GND pin of the Buck circuit in FIG. 19 are connected to the Vo pin and GND pin in FIG. 18 through the metal wiring layer of the circuit board.

It should be noted that the block diagrams shown in the above figures are functional entities and do not necessarily correspond to physically or logically independent entities. These functional entities may be implemented in the form of software, or implemented in one or more hardware modules or integrated circuits, or implemented in different networks and/or processor devices and/or microcontroller devices.

The exemplary embodiments of the present disclosure have been specifically shown and described above. It should be understood that the present disclosure is not limited to the detailed structure, arrangement or implementation method described herein; on the contrary, the present disclosure intends to cover various modifications and equivalent arrangements included in the spirit and scope of the appended claims.

What is claimed is:

1. A system of providing power, disposed on a mainboard, comprising: a preceding-stage power supply module, a post-stage power supply module and a load, wherein the preceding-stage power supply module is electrically connected to the post-stage power supply module, and the post-stage power supply module is electrically connected to the load;
   a projection on the mainboard of a smallest envelope area, which is formed by contour lines of the preceding-stage power supply module and the load, at least partially overlaps with a projection of the post-stage power supply module on the mainboard;
   the preceding-stage power supply module comprises a plurality of sets of preceding-stage output pins and preceding-stage ground pins, the preceding-stage output pins and the preceding-stage ground pins are alternately arranged to form a first rectangular envelope area, and the load is disposed on a side of a long side of the first rectangular envelope area; and
   the load comprises a load input pin and a load ground pin, the load input pin and the load ground pin form a second rectangular envelope area, and a center line of the first rectangular envelope area and the second rectangular envelope area is perpendicular to a straight line where the long side of the first rectangular envelope area is located.

2. The system according to claim 1, wherein the projection of the post-stage power supply module on the mainboard is within the projection on the mainboard of the smallest envelope area which is formed by the contour lines of the preceding-stage power supply module and the load.

3. The system according to claim 2, wherein the preceding-stage output pins and the preceding-stage ground pins are alternately arranged in a direction of the straight line where the long side of the first rectangular envelope area is located.

4. The system according to claim 1, wherein the post-stage power supply module comprises at least a set of a post-stage input pin, a post-stage output pin and a post-stage ground pin, and the post-stage input pin, the post-stage output pin and the post-stage ground pin are arranged along the center line, and in a direction directed to the load.

5. The system according to claim 2, wherein the preceding-stage output pins are connected to a first area of a first wiring layer of the mainboard through a plurality of conductive pillars; and the preceding-stage ground pins are connected to a second wiring layer of the mainboard through a plurality of conductive pillars.

6. The system according to claim 5, wherein the post-stage input pin is connected to the first area of the first wiring layer through a plurality of conductive pillars; the post-stage ground pin is connected to the second wiring layer through a plurality of conductive pillars; the post-stage output pin is connected to a second area of the first wiring layer of the mainboard through a plurality of conductive pillars; the load input pin is connected to the second area of the first wiring layer through a plurality of conductive pillars, and the load ground pin is connected to the second wiring layer through a plurality of conductive pillars.

7. The system according to claim 6, wherein a welding surface of the conductive pillar is a wavy surface.

8. The system according to claim 2, wherein the preceding-stage power supply module further comprises a power electronic device; wherein the preceding-stage output pin and the preceding-stage ground pin are arranged alternately around the power electronic device.

9. The system according to claim 2, wherein a distance from the post-stage input pin or the post-stage ground pin to the preceding-stage power supply module is less than a distance from the post-stage output pin to the preceding-stage power supply module.

10. The system according to claim 1, wherein the preceding-stage power supply module, the post-stage power supply module and the load are disposed on a same side of the mainboard, and the projection of the post-stage power supply module on the mainboard is within a projection of the load on the mainboard.

11. The system according to claim 1, wherein the preceding-stage power supply module and the load are disposed on a same side of the mainboard, the post-stage power supply module and the load are disposed on different sides of the mainboard, and the projection of the post-stage power supply module on the mainboard is within a projection of the load on the mainboard.

12. The system according to claim 1, wherein the post-stage power supply module comprises a first post-stage power supply module and a second post-stage power supply module, the load comprises a chip, the chip is a multi-core chip, the chip comprises a first core and a second core, the first post-stage power supply module is electrically connected to the first core, and the second post-stage power supply module is electrically connected to the second core.

13. The system according to claim 12, wherein the first post-stage power supply module is disposed within the smallest envelope area which is formed by the contour lines of the preceding-stage power supply module and the load, the first post-stage power supply module is close to the first core, and the second post-stage power supply module is close to the second core.

14. The system according to claim 12, wherein the preceding-stage power supply module comprises a first preceding-stage power supply module and a second preceding-stage power supply module, the first post-stage power supply module is disposed within the smallest envelope area which is formed by the contour lines of the first preceding-stage supply power supply module and the load, the second post-stage power supply module is disposed within the smallest envelope area which is formed by the contour lines of the second preceding-stage supply power supply module and the load, the first post-stage power supply module is close to the first core, and the second post-stage power supply module is close to the second core.

15. The system according to claim 1, wherein the system comprises a plurality of the preceding-stage power supply modules and a plurality of the post-stage power supply modules, the plurality of post-stage power supply modules are disposed around the load, and at least one of the post-stage power supply module is disposed within the smallest envelope area which is formed by the contour lines of the plurality of preceding-stage power supply modules and the load.

16. The system according to claim 1, wherein the preceding-stage output pin and/or the preceding-stage ground pin are bonded together by a plastic part.

17. The system according to claim 1, wherein the preceding-stage power supply module comprises an LLC converter, and the post-stage power supply module comprises a BUCK circuit.

* * * * *